(12) United States Patent
Lostedt

(10) Patent No.: US 10,497,673 B2
(45) Date of Patent: Dec. 3, 2019

(54) SYSTEMS AND METHODS OF INTERCONNECTING ELECTRICAL DEVICES

(71) Applicant: Telefonaktiebolaget LM Ericsson (publ), Stockholm (SE)

(72) Inventor: Mikael Lostedt, Glumslöv (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/081,130

(22) PCT Filed: Mar. 6, 2017

(86) PCT No.: PCT/EP2017/055193
§ 371 (c)(1),
(2) Date: Aug. 30, 2018

(87) PCT Pub. No.: WO2017/153339
PCT Pub. Date: Sep. 14, 2017

(65) Prior Publication Data
US 2019/0035766 A1   Jan. 31, 2019

Related U.S. Application Data

(60) Provisional application No. 62/305,992, filed on Mar. 9, 2016.

(51) Int. Cl.
| | | |
|---|---|---|
| *H04B 1/40* | (2015.01) | |
| *H01L 25/065* | (2006.01) | |
| *G11C 5/04* | (2006.01) | |
| *G06F 13/40* | (2006.01) | |
| *G11C 7/10* | (2006.01) | |
| *G11C 11/4093* | (2006.01) | |

(52) U.S. Cl.
CPC ............ *H01L 25/0655* (2013.01); *G11C 5/04* (2013.01); *H04B 1/40* (2013.01); *G06F 13/4068* (2013.01); *G11C 7/10* (2013.01); *G11C 11/4093* (2013.01); *Y02D 10/14* (2018.01); *Y02D 10/151* (2018.01)

(58) Field of Classification Search
CPC ............ H01L 2924/00; H01L 2224/97; H03K 19/17736; G06F 17/5054
USPC ........................ 455/550.1; 257/676, 685, 690
See application file for complete search history.

(56) References Cited

U.S. PATENT DOCUMENTS

| | | |
|---|---|---|
| 2002/0036541 A1 | 3/2002 | Buer |
| 2006/0060954 A1 | 3/2006 | Meyer-Berg |
| 2008/0094808 A1* | 4/2008 | Kanapathippillai ..... G11C 5/04 361/737 |
| 2013/0179848 A1 | 7/2013 | Liu et al. |
| 2016/0012879 A1 | 1/2016 | Eom et al. |

FOREIGN PATENT DOCUMENTS

JP     H04196581 A     7/1992

* cited by examiner

*Primary Examiner* — Sam Bhattacharya
(74) *Attorney, Agent, or Firm* — Coats & Bennett, PLLC

(57) ABSTRACT

Systems and methods of interconnecting electrical devices are provided. In one exemplary embodiment, an arrangement of interconnected electrical devices may include one or more first electrical devices with a first data flow and one or more second electrical devices with a second data flow. Further, the first electrical devices may be mirrored versions of the second electrical devices. Also, the first data flow may be substantially opposite to the second data flow.

14 Claims, 4 Drawing Sheets

SYSTEMS AND METHODS OF INTERCONNECTING ELECTRICAL DEVICES

FIELD OF DISCLOSURE

The present disclosure relates generally to the field of electronics, and in particular to interconnecting electrical devices.

BACKGROUND

When floorplanning data path directions of a system, one of the objectives is to provide a physically unobstructed throughput flow through a device such as a printed circuit board (PCB). For a wireless communication system, one of the objectives is to provide data flows in opposite directions without degrading performance. For a radio communication system, the data path is typically bi-directional between a network and a radio frequency (RF) transceiver and corresponding antenna(s). This bi-directional data path provides uplink data from the RF transceiver to the network and provides downlink data from the network to the RF transceiver. Further, the incessant demand for higher data throughput and the processing complexity of converting between divergent communication systems such as Ethernet, Common Public Radio Interface (CPRI), 2G, 3G and 4G communication systems such as Long Term Evolution (LTE), Universal Mobile Terrestrial System (UMTS), 5G communication systems such as LTE-NX, and the like continue to increase the processing requirements of the system. Also, the addition of new technologies such as antenna arrays and antenna beamforming techniques also increase the processing requirements of the system.

In conventional systems, an Application Specific Integrated Circuit (ASIC) or a Field Programmable Gate Array (FPGA) typically processes a data flow in one direction only (e.g., uni-directional). With the addition of another ASIC or FPGA, the system processes data flows in multi-directions (e.g., bi-directional). Further, each ASIC or FPGA may be packaged in a discrete package, which may be rotated in relation to another ASIC or FPGA package to improve the data flows through a PCB. As ASIC processing technology continues to advance, more processing performance can be obtained from one ASIC or FPGA die. Further, as geometries in semiconductor processing continue to shrink, the ability to include multiple ASIC or FPGA dice into a single package becomes more achievable and cost effective. Also, the use of the same type of ASIC or FPGA die for multi-directional signal processing may provide certain advantages since only one architecture needs to be developed and qualified. However, one of the problems with having the same type of die in a package is that the data paths within the package become uni-directional, which may be resolved by performing more complicated routing on a PCB. Another technique is to mount one die rotated by one hundred and eighty degrees (180°) relative to the other die. However, a control flow of each die may cause congestion in the package.

US2006/0060954 describes a multichip module comprising semiconductor chips on a support medium wherein at least one second semiconductor chip includes an arrangement of contact areas which is mirror-inverted in relation to a first semiconductor chip.

US2016/0012879 describes a multi channel semiconductor device having multi dies. First and second dies may be disposed in a mirror die form and be packaged in a single package.

The Background section of this document is provided to place embodiments of the present disclosure in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the disclosure or to delineate the scope of the disclosure. The sole purpose of this summary is to present some concepts disclosed herein in a simplified form as a prelude to the more detailed description that is presented later.

Briefly described, embodiments of the present disclosure relate to interconnecting electrical devices. According to one aspect, an arrangement of interconnected electrical devices may include one or more first electrical devices with a first data flow and one or more second electrical devices with a second data flow. Further, the first electrical devices are mirrored versions of the second electrical devices, and the first data flow is substantially opposite to the second data flow.

According to another aspect, a method of interconnecting electrical devices may include mounting one or more first electrical devices having a first data flow to a substrate. Further, the method may include mounting one or more second electrical device having a second data flow to the substrate. The first electrical devices may be mirrored versions of the second electrical devices. Also, the first data flow may be substantially opposite to the second data flow.

The invention is described in the independent claims. Further embodiments are described in the dependent claims.

BRIEF DESCRIPTION OF THE DRAWINGS

The present disclosure will now be described more fully hereinafter with reference to the accompanying drawings, in which embodiments of the disclosure are shown. However, this disclosure should not be construed as limited to the embodiments set forth herein. Rather, these embodiments are provided so that this disclosure will be thorough and complete, and will fully convey the scope of the disclosure to those skilled in the art. Like numbers refer to like elements throughout.

DETAILED DESCRIPTION

For simplicity and illustrative purposes, the present disclosure is described by referring mainly to an exemplary embodiment thereof. In the following description, numerous specific details are set forth in order to provide a thorough understanding of the present disclosure. However, it will be readily apparent to one of ordinary skill in the art that the present disclosure may be practiced without limitation to these specific details. In this description, well known methods and structures have not been described in detail so as not to unnecessarily obscure the present disclosure.

Figure 1:
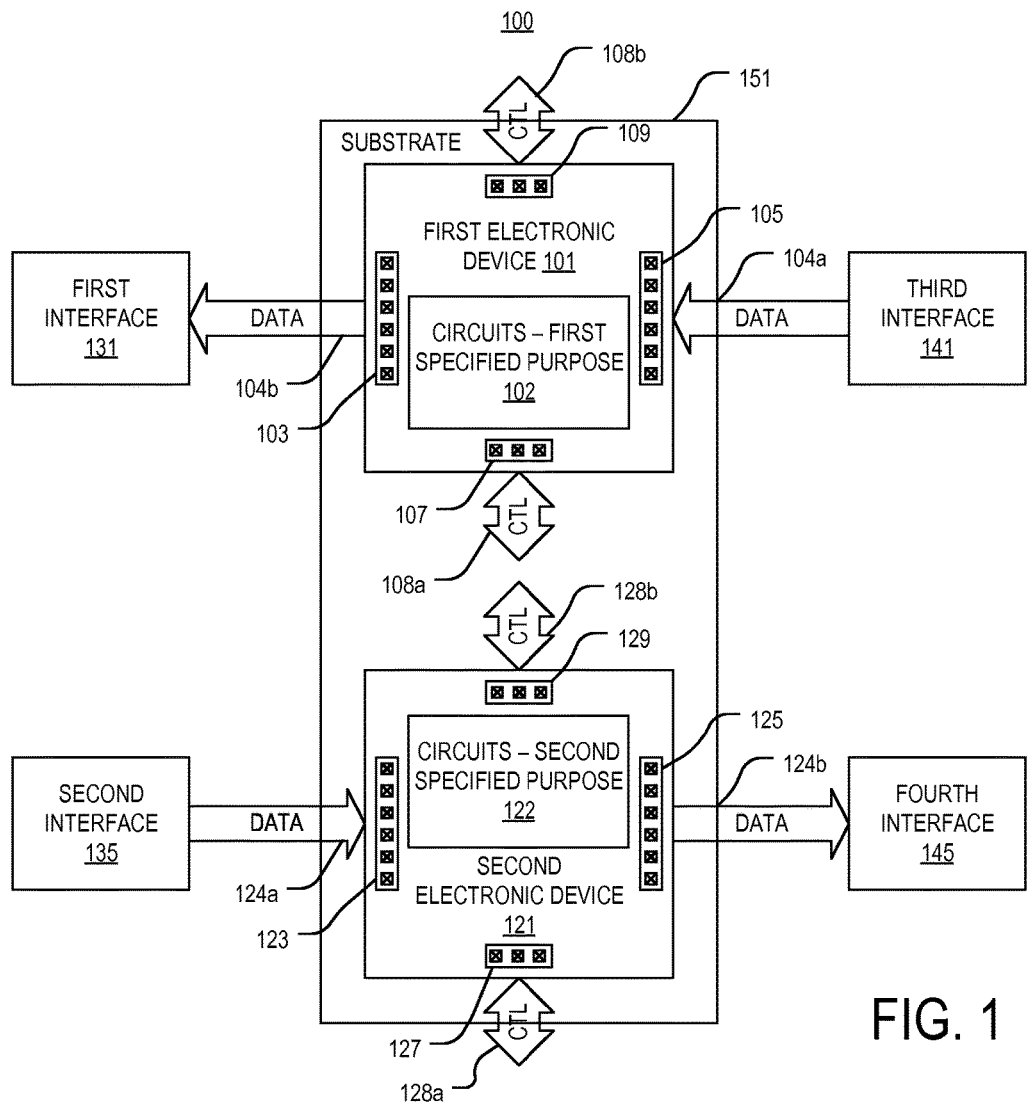
FIG. 1 illustrates one embodiment of a system for interconnecting electrical devices in accordance with various aspects as described herein.

This disclosure includes describing systems and methods of interconnecting electrical devices. For example, FIG. 1 illustrates one embodiment of a system 100 for interconnecting electrical devices in accordance with various aspects as described herein. In FIG. 1, the system 100 may include a first electrical device 101 and a second electrical device 121. The first electrical device 101 may corresponds to a first die and the second electrical device 121 may correspond to a second die. Further, the first die may be a mirror image of the second die. Each of the first and second electrical devices 101 and 121 may be mounted on the same or different substrates. In one example, the electrical devices 101 and 121 are mounted on the same substrate 151. In another example, the first electrical device 101 is mounted on one substrate and the second electrical device 121 is mounted on a different substrate. A substrate may correspond to a printed circuit board (PCB), a package, or the like. A package such as a semiconductor package may be a metal, plastic, glass, ceramic or the like casing having one or more electrical devices mounted in the package. The first electrical device 101 may include an arrangement of electrical connectors 103, 105, 107 and 109. The electrical connectors 103 and 105 may correspond to a data flows 104a-b. Further, the electrical connectors 103 and 105 may be coupled to respective first and third interfaces 131 and 141. An interface may couple one system to another system. The electrical connectors 107 and 109 may correspond to a control flows 108a-b. The data flow 104a-b may be substantially perpendicular to the control flow 108a-b.

In FIG. 1, the first electrical device 101 may have a first specified purpose. The first electrical device 101 may include circuits 102 for performing the first specified purpose. A circuit may include any combination of a processor, a controller, a state machine, a digital signal processor (DSP), a field programmable gate array (FPGA), digital logic, analog logic, radio frequency (RF) circuits, memory, and the like. The first specified purpose may correspond to multi-directional signal processing. Multi-directional signal processing may include audio signal processing, speech signal processing, image processing, video processing, wireless communication, control systems, array processing, and the like. Further, the first specified purpose may correspond to one or more directions of the multi-directional signal processing. For example, the first specified purpose corresponds to an uplink direction of a communication system. A communication system may include Ethernet, Common Public Radio Interface (CPRI), 2G, 3G and 4G communication systems such as Long Term Evolution (LTE) and Universal Mobile Terrestrial System (UMTS), 5G communication systems such as LTE-NX, or the like.

In the current embodiment, the second electrical device 121 may include circuits 122 for performing a second specified purpose. The second specified purpose may be the same or different than the first specified purpose of the first electrical device 101. The second specified purpose may correspond to one or more directions of the multi-directional signal processing. For example, the first and second specified purposes correspond to a respective uplink and downlink directions of a wireless communication system. The second electrical device 121 may include an arrangement of electrical connectors 123, 125, 127 and 129. The electrical connectors 123 and 125 may correspond to a data flow 124a-b. Further, the electrical connectors 123 and 125 may be coupled to respective second and fourth interfaces 135 and 145. The electrical connectors 127 and 129 may correspond to a control flow 128a-b. The data flow 124a-b may be substantially perpendicular to the control flow 128a-b. Further, the data flow 104a-b may be substantially parallel to the data flow 124a-b and the control flow 108a-b may be substantially parallel to the control flow 128a-b.

Figure 2:
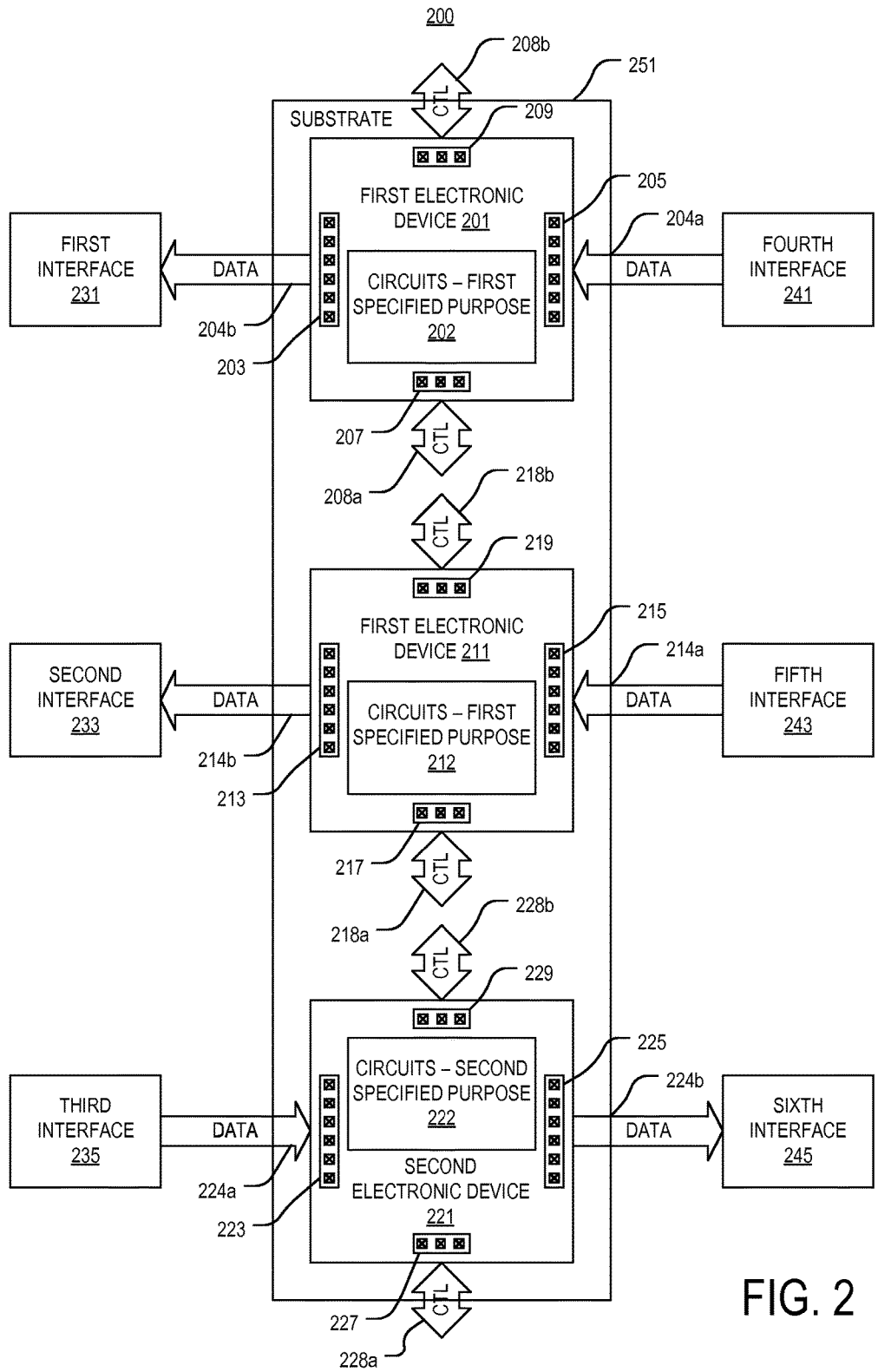
FIG. 2 illustrates another embodiment of a system for interconnecting electrical devices in accordance with various aspects as described herein.

FIG. 2 illustrates one embodiment of a system 200 for interconnecting electrical devices in accordance with various aspects as described herein. In FIG. 2, the system 200 may include first electrical devices 201 and 211 and a second electrical device 221. The first electrical devices 201 and 211 may correspond to first and second dies and the second electrical device 221 may correspond to a third die. Further, the first die may be the same as the second die. Also, the third die may be a mirror image of at least one of the first and second dies. Each of the first electrical devices 201 and 211 and the second electrical device 221 may be mounted on the same or different substrates. In one example, the electrical devices 201, 211 and 221 are mounted on the same substrate 251. In another example, the first electrical devices 201 and 211 are mounted on the same substrate and the second electrical device 221 may be mounted on a different substrate. The first electrical device 201 may include an arrangement of electrical connectors 203, 205, 207 and 209. The electrical connectors 203 and 205 may correspond to a data flow 204a-b. Further, the electrical connectors 203 and 205 may be coupled to respective first and fourth interfaces 231 and 241. The electrical connectors 207 and 209 may correspond to a control flow 208a-b.

Similarly, the second electrical device 211 may include an arrangement of electrical connectors 213, 215, 217 and 219. The electrical connectors 213 and 215 may correspond to a data flow 214a-b. Further, the electrical connectors 213 and 215 may be coupled to respective second and fifth interfaces 233 and 243. The electrical connectors 217 and 219 may correspond to a control flow 218a-b. The data flows 204a-b and 214a-b of each first electrical device 201 and 211 may be substantially perpendicular to the control flows 208a-b and 218a-b of each first electrical device 201 and 211. The first electrical devices 201 and 211 may be arranged so that an arrangement of the electrical connectors 203, 205, 207 and 209 of the first electrical device 201 may be the same as an arrangement of the corresponding electrical connectors 213, 215, 217 and 219 of the first electrical device 211.

In FIG. 2, each first electrical device 201 and 211 may have a first specified purpose. Each first electrical device 201 and 211 may include circuits 202 and 212, respectively, for performing the first specified purpose. The second electrical device 221 may include circuits 222 for performing a second specified purpose. The second specified purpose may be different than the first specified purpose of the first electrical devices 201 and 211. The second electrical device 221 may include an arrangement of electrical connectors 223, 225, 227 and 229. The electrical connectors 223 and 225 may correspond to a data flow 224a-b. Further, the electrical connectors 223 and 225 may be coupled to respective third and sixth interfaces 235 and 245. The electrical connectors 227 and 229 may correspond to a control flow 228a-b. The data flow 224*a-b* may be substantially perpendicular to the control flow 228*a-b*. Further, the data flow 224*a-b* and the control flow 228*a-b* of the second electrical device 221 may be substantially parallel to the respective data flows 204*a-b* and 214*a-b* and control flows 208*a-b* and 218*a-b* of the first electrical devices 201 and 211.

In one embodiment, an arrangement of interconnected electrical devices may include one or more first electrical devices with a first data flow and one or more second electrical devices with a second data flow. Further, the first electrical devices are mirrored versions of the second electrical devices, and the first data flow is substantially opposite to the second data flow.

In another embodiment, the mirrored versions correspond to an arrangement of electrical connectors of the first electrical devices being a mirror image of an arrangement of corresponding electrical connectors of the second electrical devices.

In another embodiment, the first electrical devices may include a first control flow and the second electrical devices may include a second control flow. Further, the first and second control flows may be substantially perpendicular to the first and second data flows.

In another embodiment, traces corresponding to the first and second data flows may be on a different layer of a printed circuit board (PCB) or package than traces corresponding to the first and second control flows.

In another embodiment, traces corresponding to the first data flow may be on a different layer of a printed circuit board (PCB) or a package than traces corresponding to the second data flow.

In another embodiment, the first electrical devices may have a first specified purpose and the second electrical devices may have a second specified purpose.

In another embodiment, the first electrical devices may have the same specified purpose as the second electrical devices.

In another embodiment, the first and second specified purposes may be associated with multi-directional signal processing and may correspond to different directions of the multi-directional signal processing.

In another embodiment, the first and second specified purposes may correspond to a respective first and second directions of a multi-directional signal processing with a processing load of the first direction being different than a processing load of the second direction.

In another embodiment, a processing load for processing the first data flow by the first electrical devices may be different than a processing load for processing the second data flow by the second electrical devices.

In another embodiment, the first and second data flows may correspond to a respective uplink and a downlink of a communication system.

In another embodiment, each of the first and second data flows may be unidirectional.

In another embodiment, each of the first and second electrical devices may correspond to an application specific integrated circuit (ASIC) or a field programmable gate array (FPGA).

In another embodiment, each of the first and second electrical devices may correspond to a die.

In another embodiment, each of the first and second electrical devices may be mounted on a substrate.

In another embodiment, the substrate may correspond to a printed circuit board (PCB) or a package.

In another embodiment, each electrical device may be substantially rectangular with electrical connectors on each side.

In another embodiment, the first electrical device may correspond to a first die and the second electrical device may correspond to a second die, and the first die may be a mirror image of the second die.

In another embodiment, the first electrical devices may correspond to a first and second dies and the second electrical device may correspond to a third die, and the first die may be the same as the second die and the third die may be a mirror image of each of the first and second dies.

In another embodiment, the arrangement of electrical connectors for each first electrical device and an arrangement of electrical connectors for each second electrical device may be grouped by type of interface.

In another embodiment, the type of interface may include an interface to a network and an interface to radio frequency (RF) circuitry.

In another embodiment, a method of interconnecting electrical devices may include mounting one or more first electrical devices having a first data flow to a substrate. Further, the method may include mounting one or more second electrical device having a second data flow to the substrate. The first electrical devices may be mirrored versions of the second electrical devices. Also, the first data flow may be substantially opposite to the second data flow.

In another embodiment, an apparatus of interconnected electrical devices, the apparatus may be adapted to mount one or more first electrical devices having a first data flow to a substrate. Further, the apparatus may be adapted to mount one or more second electrical device having a second data flow to the substrate. the first electrical devices may be mirrored versions of the second electrical devices. Also, the first data flow may be substantially opposite to the second data flow.

In another embodiment, an apparatus of interconnected electrical devices may include means for mounting one or more first electrical devices having a first data flow to a substrate. Further, the apparatus may include means for mounting one or more second electrical device having a second data flow to the substrate. The first electrical devices may be mirrored versions of the second electrical devices. Also, the first data flow may be substantially opposite to the second data flow.

Figure 3:
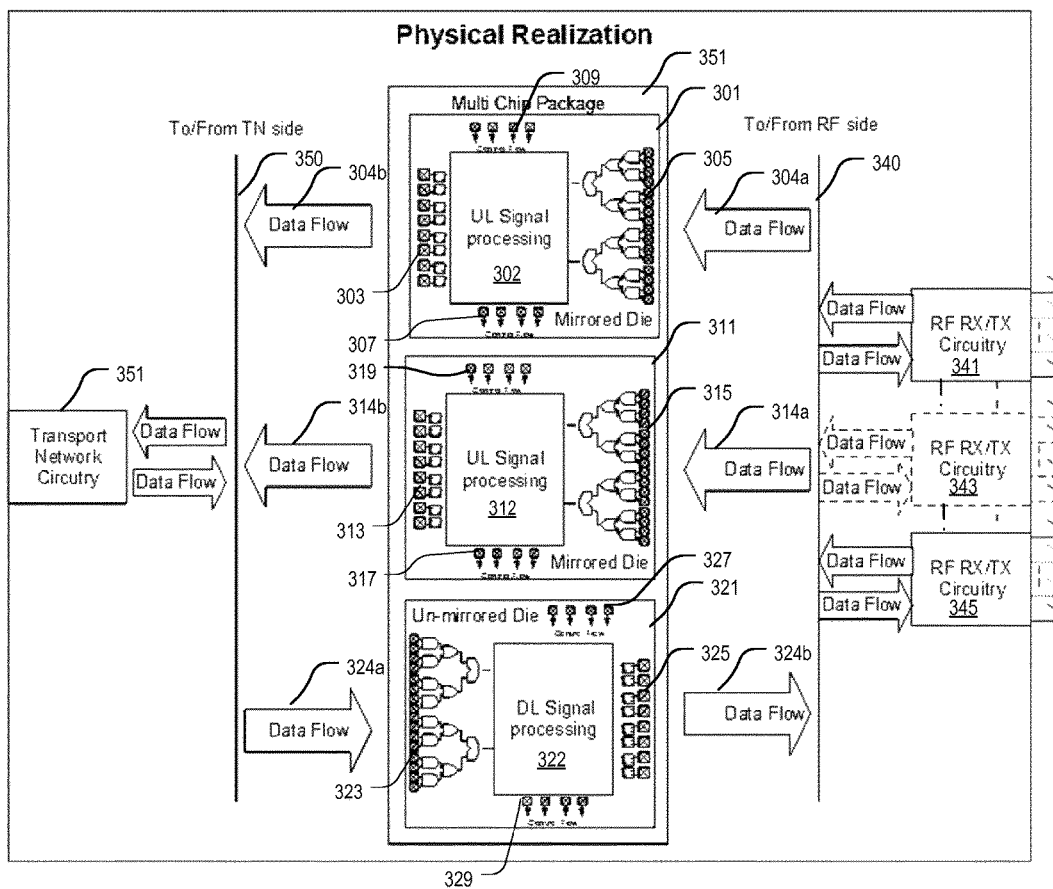
FIG. 3 illustrates another embodiment of a system for interconnecting electrical devices in accordance with various aspects as described herein.

FIG. 3 illustrates another embodiment of a system 300 for interconnecting electrical devices in accordance with various aspects as described herein. In FIG. 3, the system 300 may include first electrical devices 301 and 311 and a second electrical device 321. The first electrical devices 301 and 311 may correspond to a first and second dies and the second electrical device 321 may correspond to a third die. Further, the first die may be the same as the second die. Also, the third die may be a mirror image of at least one of the first and second dies. Each of the first electrical devices 301 and 311 and the second electrical device 321 may be mounted on the same substrate 351. The first electrical device 301 may include an arrangement of electrical connectors 303, 305, 307 and 309. The electrical connectors 303 and 305 may correspond to a data flow 304*a-b*. Further, the electrical connectors 307 and 309 may correspond to a control flow.

Similarly, the second electrical device 311 may include an arrangement of electrical connectors 313, 315, 317 and 319. The electrical connectors 313 and 315 may correspond to a data flow 314*a-b*. Further, the electrical connectors 317 and 319 may correspond to a control flow. The data flows 304*a-b* and 314*a-b* of each first electrical device 301 and 311 may be substantially perpendicular to the control flows of each first electrical device 301 and 311. The first electrical devices 301 and 311 may be arranged so that an arrangement of the electrical connectors 303, 305, 307 and 309 of the first electrical device 301 may be the same as an arrangement of the corresponding electrical connectors 313, 315, 317 and 319 of the first electrical device 311.

In FIG. 3, each first electrical device 301 and 311 may have a first specified purpose such as uplink (UL) signal processing for a communication system. Each first electrical device 301 and 311 may include circuits 302 and 312, respectively, for performing the first specified purpose. The second electrical device 321 may have a second specified purpose such as downlink (DL) signal processing for the communication system. The second electrical device 321 may include circuits 322 for performing the second specified purpose. The second electrical device 321 may include an arrangement of electrical connectors 323, 325, 327 and 329. The electrical connectors 323 and 325 may correspond to a data flow 324a-b. Further, the electrical connectors 327 and 329 may correspond to a control flow. The data flow 324a-b may be substantially perpendicular to the control flow. Further, the data flow 324a-b and the control flow of the second electrical device 321 may be substantially parallel to the respective data flows 304a-b and 314a-b and control flows of the first electrical devices 301 and 311. The electrical connectors 303, 313 and 323 of the electrical devices 301, 311 and 321 may be coupled to a network interface 350. The network interface 350 may also be coupled to a network 351. Further, the network interface 350 may transfer the data flows 304b, 314b and 324a between the network 351 and the electrical devices 301, 311 and 321. The electrical connectors 305, 315 and 325 of the respective electrical devices 301, 311 and 321 may be coupled to an RF interface 340. The RF interface 340 may also be coupled to RF circuitry 341-345. Further, the RF interface 340 may transfer the data flows 304a, 314a and 324b between the RF circuitry 341-345 and the electrical devices 301, 311 and 321.

Figure 4:
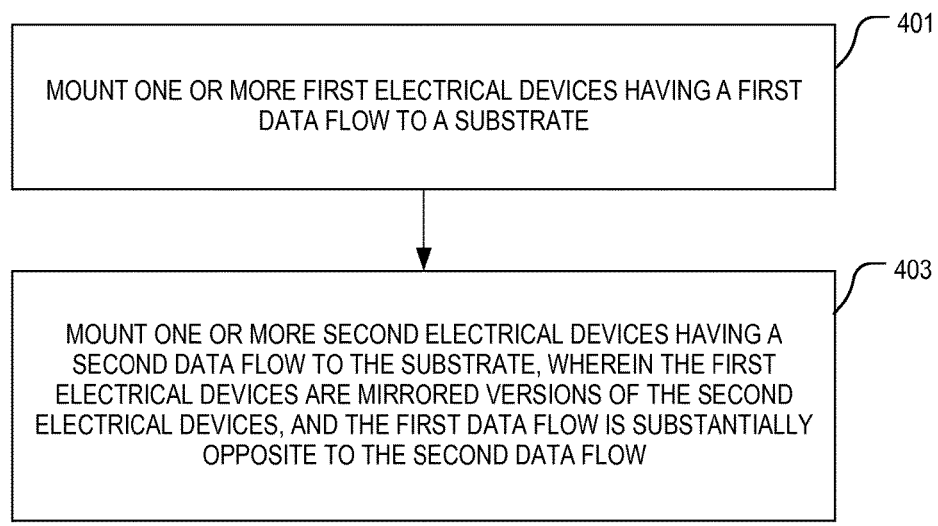
FIG. 4 illustrates one embodiment of a method of interconnection electrical devices in accordance with various aspects as described herein.

FIG. 4 illustrates one embodiment of a method 400 of interconnection electrical devices in accordance with various aspects as described herein. In FIG. 4, the method 400 may start, for instance, at block 401 where it may mount one or more first electrical devices having a first data flow to a substrate. At block 403, the method 400 may include mounting one or more second electrical devices having a second data flow to the substrate. Further, the first electrical devices may be mirrored versions of the second electrical devices. The first data flow may be substantially opposite to the second data flow.

Abbreviations:

| Abbreviation | Explanation |
| --- | --- |
| ASIC | Application Specific Integrated Circuit |
| DL | Down Link |
| FPGA | Field Programmable Gate Array |
| MCP | Multi Chip Package |
| PCB | Printed Circuit Board |
| UL | Uplink |

Figure 5:
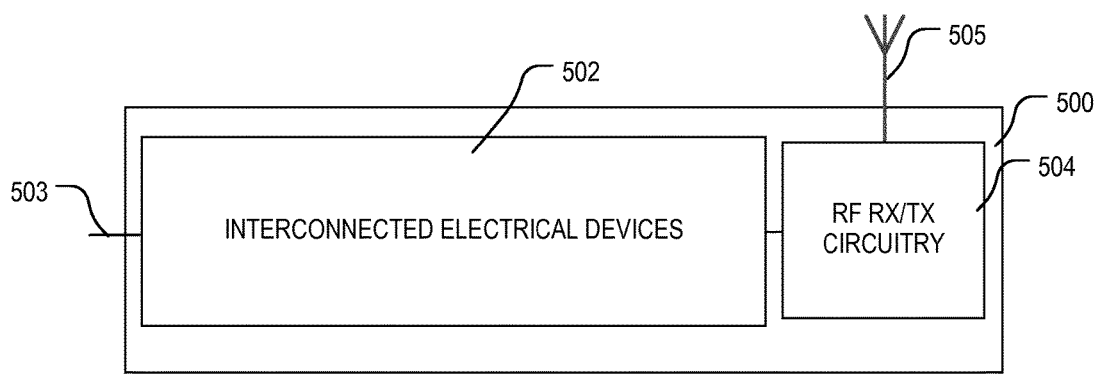
FIG. 5 illustrates a wireless communication device.

FIG. 5 illustrates a wireless communication device 500 comprising an arrangement of interconnected electrical devices 502 as described above in conjunction with FIGS. 1-3. The wireless communication device may e.g. be a base station or a mobile communication device such as a smartphone or an Internet of Things device or another mobile device or module which is capable of radio communication.

The wireless communication device 500 comprises the arrangement of interconnected electrical devices 502 and radio frequency transceiver circuitry 504. The wireless communication device may optionally comprise an antenna 505. The arrangement of interconnected electrical devices 502 may be connected to the transceiver circuitry via an interface 340 as shown in FIG. 3 in such a way that the data flow through an un-mirrored die 321 continues through the transmitter part of the transceiver circuitry 504 and data flowing through the receiver party of the transceiver circuitry 504 continues through the mirrored dies 301, 311. The arrangement of interconnected electrical devices may be further connected to additional circuitry via interface 503. It may e.g. be connected to transport network circuitry 351 via interface 350 as shown in FIG. 3.

US2006/0060954 utilises mirroring on the edges of semiconductor chips in order to reduce criss-crossing of wires on the PCB. The mirrored dies used in the arrangement of the invention further reduce or eliminate criss-crossing within the semiconductors themselves.

The mirrored and un-mirrored dies in the invention may be utilized as part of an unbalanced design as shown in FIGS. 2 and 3. In those embodiments two dies are used for uplink signal processing and one for downlink signal processing. It should be clear to one skilled in the art that the numbers of mirrored and un-mirrored dies may be varied as necessary. The arrangement may thus be tailored to suit the uplink and downlink throughput requirements of a particular device such as the wireless communication device 500. The invention thus provides additional flexibility in circuit design.

The possibly mirrored multi-dies described in US2016/0012879 are used e.g. as part of a memory device such as a DRAM and information is routed in specified ways through the package. The advantage of the invention is that data flows in one direction through the mirrored die and in the opposite direction through the un-mirrored die. A simplified and efficient routing of data within a device has thus been provided.

The previous detailed description is merely illustrative in nature and is not intended to limit the present disclosure, or the application and uses of the present disclosure. Furthermore, there is no intention to be bound by any expressed or implied theory presented in the preceding field of use, background, summary, or detailed description. The present disclosure provides various examples, embodiments and the like, which may be described herein in terms of functional or logical block elements. The various aspects described herein are presented as methods, devices (or apparatus), systems, or articles of manufacture that may include a number of components, elements, members, modules, nodes, peripherals, or the like. Further, these methods, devices, systems, or articles of manufacture may include or not include additional components, elements, members, modules, nodes, peripherals, or the like.

Furthermore, the various aspects described herein may be implemented using standard programming or engineering techniques to produce software, firmware, hardware (e.g., circuits), or any combination thereof to control a computing device to implement the disclosed subject matter. It will be appreciated that some embodiments may be comprised of one or more generic or specialized processors such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the methods, devices and systems described herein. Alternatively, some or all functions could be implemented by a state machine that has no stored program instructions, or in one or more application specific integrated circuits (ASICs), in which each function or some combinations of certain of the functions are implemented as custom logic circuits. Of course, a combination of the two approaches may be used. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The term "article of manufacture" as used herein is intended to encompass a computer program accessible from any computing device, carrier, or media. For example, a computer-readable medium may include: a magnetic storage device such as a hard disk, a floppy disk or a magnetic strip; an optical disk such as a compact disk (CD) or digital versatile disk (DVD); a smart card; and a flash memory device such as a card, stick or key drive. Additionally, it should be appreciated that a carrier wave may be employed to carry computer-readable electrical data including those used in transmitting and receiving electronic data such as electronic mail (e-mail) or in accessing a computer network such as the Internet or a local area network (LAN). Of course, a person of ordinary skill in the art will recognize many modifications may be made to this configuration without departing from the scope or spirit of the subject matter of this disclosure.

Throughout the specification and the embodiments, the following terms take at least the meanings explicitly associated herein, unless the context clearly dictates otherwise. Relational terms such as "first" and "second," and the like may be used solely to distinguish one entity or action from another entity or action without necessarily requiring or implying any actual such relationship or order between such entities or actions. The term "or" is intended to mean an inclusive "or" unless specified otherwise or clear from the context to be directed to an exclusive form. Further, the terms "a," "an," and "the" are intended to mean one or more unless specified otherwise or clear from the context to be directed to a singular form. The term "include" and its various forms are intended to mean including but not limited to. References to "one embodiment," "an embodiment," "example embodiment," "various embodiments," and other like terms indicate that the embodiments of the disclosed technology so described may include a particular function, feature, structure, or characteristic, but not every embodiment necessarily includes the particular function, feature, structure, or characteristic. Further, repeated use of the phrase "in one embodiment" does not necessarily refer to the same embodiment, although it may. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. A device or structure that is "configured" in a certain way is configured in at least that way, but may also be configured in ways that are not listed.

The invention claimed is:

1. An arrangement of interconnected electrical devices, the arrangement comprising:
   one or more first electrical devices with a first data flow extending across at least a portion of each first electrical device;
   one or more second electrical devices with a second data flow extending across at least a portion of each second electrical device; and
   wherein the first electrical devices are mirrored versions of the second electrical devices;
   wherein each of the one or more first and second electrical devices correspond to an application specific integrated circuit (ASIC) or a field programmable gate array (FPGA);
   wherein each of the one or more first and second electrical devices are assembled in a package;
   wherein the first data flow is substantially opposite to the second data flow.

2. The arrangement of claim 1, wherein the mirrored versions comprise an arrangement of electrical connectors of the first electrical devices being a mirror image of an arrangement of corresponding electrical connectors of the second electrical devices.

3. The arrangement of claim 1:
   wherein the first electrical devices include a first control flow;
   wherein the second electrical devices include a second control flow;
   wherein the first and second control flows are substantially perpendicular to the first and second data flows.

4. The arrangement of claim 3, wherein traces corresponding to the first and second data flows are on a different layer of the printed circuit board or package than traces corresponding to the first and second control flows.

5. The arrangement of claim 1, wherein traces corresponding to the first data flow are on a different layer of a printed circuit board or a package than traces corresponding to the second data flow.

6. The arrangement of claim 1, wherein one of the first and second data flows corresponds to an uplink of a communication system; wherein the other of the first and second data flows corresponds to a downlink of the communication system.

7. The arrangement of claim 1, wherein each of the first and second data flows is unidirectional.

8. The arrangement of claim 1:
   wherein the first electrical device corresponds to a first die;
   wherein the second electrical device corresponds to a second die;
   wherein the first die is a mirror image of the second die.

9. The arrangement of claim 1:
   wherein the first electrical devices correspond to a first and second dies;
   wherein the second electrical device corresponds to a third die;
   wherein the first die is the same as the second die; and
   wherein the third die is a mirror image of each of the first and second dies.

10. The arrangement of claim 2, wherein the arrangement of electrical connectors for each first electrical device and an arrangement of electrical connectors for each second electrical device are grouped by type of interface.

11. The arrangement of claim 10, wherein the type of interface includes an interface to a network and an interface to radio frequency circuitry.

12. A wireless communication device, comprising
radio frequency transceiver circuitry; and
an arrangement of interconnected electrical devices operatively connected to the radio frequency transceiver circuitry, the arrangement comprising:
one or more first electrical devices with a first data flow extending across at least a portion of each first electrical device;
one or more second electrical devices with a second data flow extending across at least a portion of each second electrical device;
wherein the first electrical devices are mirrored versions of the second electrical devices;
wherein each of the one or more first and second electrical devices correspond to an application specific integrated circuit (ASIC) or a field programmable gate array (FPGA);
wherein each of the one or more first and second electrical devices are assembled in a package; and
wherein the first data flow is substantially opposite to the second data flow.

13. The wireless communication device of claim 12, where the wireless communication device is a base station.

14. The wireless communication device of claim 12, where the wireless communication device is a mobile communication device.

* * * * *